United States Patent [19]

Tsur et al.

[11] Patent Number: 4,656,424
[45] Date of Patent: Apr. 7, 1987

[54] APPARATUS AND METHODS FOR SELECTIVE EXCITATION

[76] Inventors: Yuval Tsur; Tomas Duby; Saul Stokar, all of c/o Elscint Ltd. P.O.B. 5258, Haifa 31051, Israel

[21] Appl. No.: 668,945
[22] Filed: Nov. 7, 1984
[51] Int. Cl.⁴ ........................................... G01R 33/20
[52] U.S. Cl. .................................... 324/309; 324/314
[58] Field of Search ............... 324/309, 307, 314, 313, 324/300

[56] References Cited

U.S. PATENT DOCUMENTS

| | | | |
|---|---|---|---|
| 4,070,611 | 1/1978 | Ernst | 324/309 |
| 4,307,343 | 12/1981 | Likes | 324/307 |
| 4,307,344 | 12/1981 | Walters | 324/307 |
| 4,486,708 | 12/1984 | Macovski | 324/309 |
| 4,516,582 | 5/1985 | Redington | 324/309 X |
| 4,521,733 | 6/1985 | Bottomley et al. | 324/309 |
| 4,528,985 | 7/1985 | Macovski | 324/309 X |
| 4,532,473 | 7/1985 | Wehrli | 324/309 X |
| 4,587,489 | 5/1986 | Wehrli | 324/309 |

OTHER PUBLICATIONS

G. Johnson et al., Instrumentation for NMR Spin-Warp Imaging, J. Phys. E: Sci. Instrum., vol. 15, #1, Jan. 1982.

R. Sutherland et al., Three-Dimensional NMR Imaging Using Selective Excitation, J. Phys. E: Sci. Instrum. vol. 11, 1978.

P. Mansfield et al., Fast Scan Proton Density Imaging by NMR, J. Phys. E: Sci. Instrum. vol. 9, 1976.

Primary Examiner—Stewart J. Levy
Assistant Examiner—Scott M. Oldham
Attorney, Agent, or Firm—Sandler & Greenblum

[57] ABSTRACT

Arrangements for selectively exciting sections of bodies being imaged in NMR systems wherein the rotating magnetic fields are shaped with envelopes defined by the sum of a sinc function and a cosine function.

14 Claims, 5 Drawing Figures

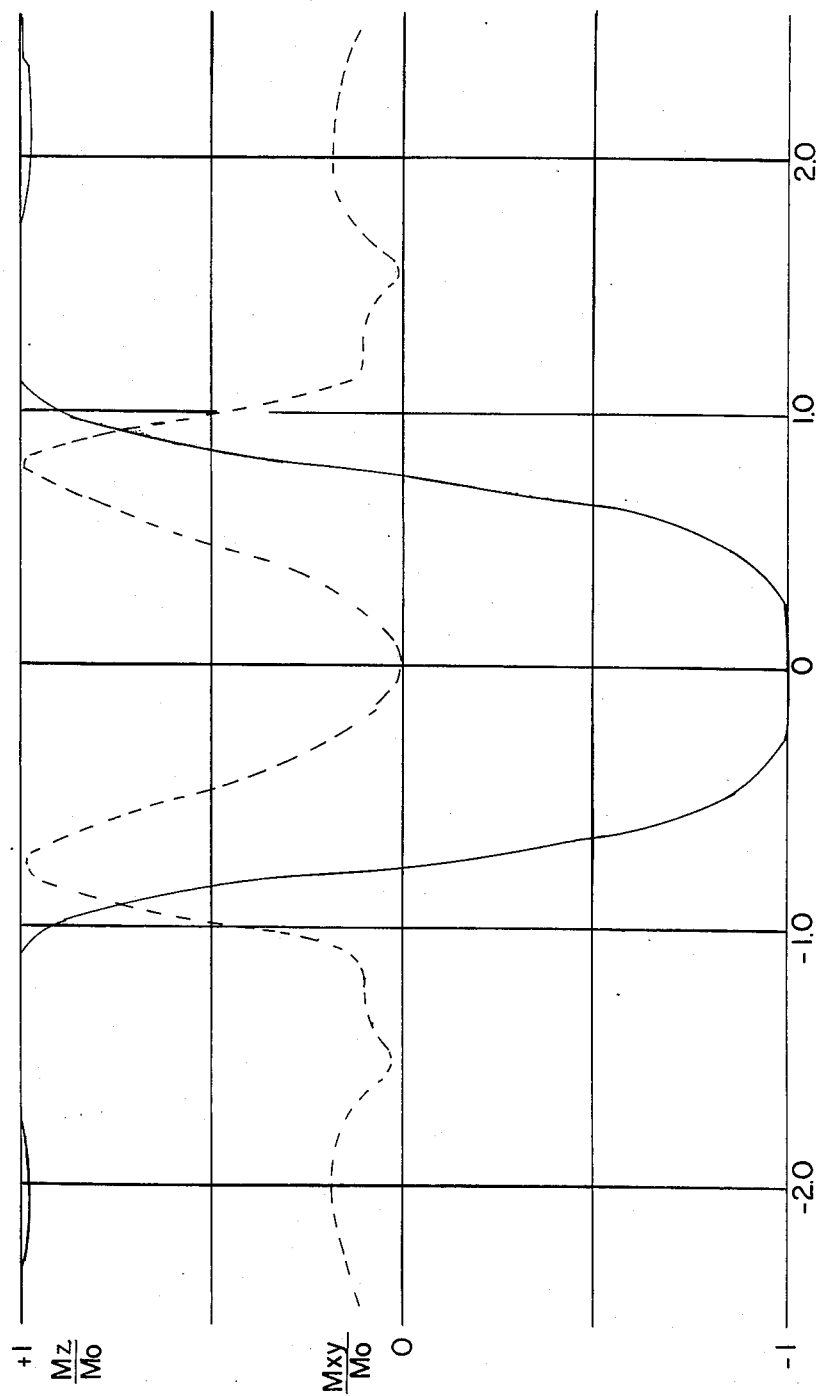

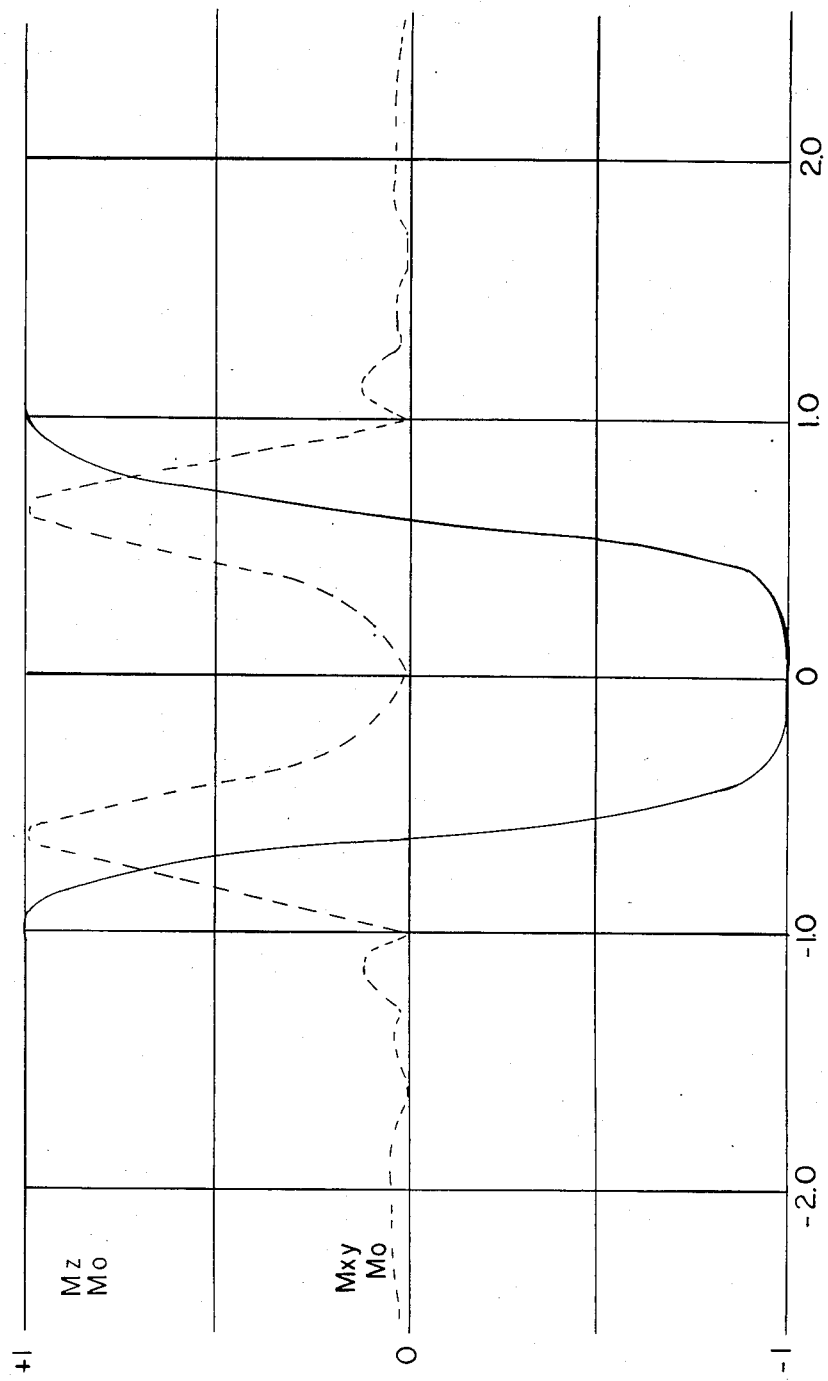

APPARATUS AND METHODS FOR SELECTIVE EXCITATION

FIELD OF THE INVENTION

This present invention relates to nuclear magnetic resonance (NMR) imaging systems and more particularly to arrangements for selectively exciting sections of bodies being imaged in such NMR systems.

BACKGROUND OF THE INVENTION

Medical Imaging, in general, is the pictorial representation of the spatial distribution of one or more measured properties of a selected region of a patient being imaged. In x-ray computerized tomographic (CT) imaging devices, for example, the region is selected by directing the x-rays to a specific region of interest. The property measured by the x-ray devices is the x-ray absorption characteristic of the organs, tissue and bones in the section being images.

In NMR imaging systems, the region of interest of the patient's body is selected by a combination of a constant static magnetic field, one or more time dependent magnetic field gradients and a radio frequency pulse of a certain frequency and time dependent amplitude.

It is known that certain elements, such as hydrogen (the element most prevelant in the human body), passes nuclei with non-zero nuclear spins. Such nuclei exert magnetic moments which are normally randomly distributed. However materials containing such nuclei are macroscopically magnetized when a strong static field is applied which aligns the nuclear magnet moments in the direction of the static magnetic field.

When the aligned nuclear magnetic moments are subjected to an additional magnetic field that is perpendicular to the static field and rotates at a specified frequency, the nuclei will change their orientation with respect to the static field. This specified frequency is called Larmor's frequency and is defined by:

$$f = \gamma H_0 / 2\pi$$

Where
f = frequency in Hertz
$\gamma$ = a constant specific for the particular type of nucleus in Hertz/Gauss
Ho = static magnetic field in Gauss In practice the Larmor frequency is in the radio-frequency (RF) region. This perpendicular rotating field is applied in the form of pulses of certain temporal dependence which is the subject of this invention.

When the rotating magnetic field is removed, the nuclear spins:

(1) Start to precess around the direction of the static magnetic field; and (2) Return slowly to their original orientation parallel with the static field.

This nuclear precession induces a voltage in a properly located receiving coil, which is amplified and processed. The resulting signal is called the Free Induction Decay (FID) signal. It is a measure of the density of the excited nuclei precessing within the detection area of the receiving coil.

By placing a patient in such a magnetic field Ho and applying RF pulses, signals from the patient's body can be detected.

In addition to the static magnetic field and the RF pulses, the patient is subjected to time dependent magnetic fields which:

(1) Are differently oriented with respect to the constant magnetic field when one or more gradients are applied during the RF pulse; and (2) precess with different Larmor frequences when gradients are applied during FID signal observation.

Thus the gradients enable spatial resolution and define the location of different parts of the body in the received signal. Therefore it is possible to create images of the proton (hydrogen) distribution within the patient's body.

As is well known there are three basic relaxation times which are: (1) the spin-lattice or longitudinal relaxation time T1; (2) the spin-spin relaxation time T2; and (3) the decay time T*2 of the FID signal due to field inhomogeneities.

The longitudinal relaxation time T1 is the time constant determined by the time required for the nuclear magnetization to return to its original direction after the application of an RF pulse. That is the time it takes for the nuclei to reach equilibrium with their environment (lattice) after the RF pulse.

The spin-spin relaxation time T2 is the time constant determined by the time required for the nuclei that have been reoriented by the RF pulse from the original direction imposed by the static magnetic field to go out of phase with each other because of the effects of the neighboring spins.

The transverse relaxation time T*2 is the time constant determined by the decay of the FID signal due to field inhomogeneities including magnetic field gradients which cause the individual nuclear magnetic moments to precess at different frequencies and hence go out of phase.

There are many different operating procedures for acquiring the spin densities and the relaxation times within a selected region of the patient's body. Among the variables adjusted to provide different types of images are the time duration, shape and amplitude of the RF pulse. For example, the RF pulse can be applied so that the nuclear magnetization is rotated 90 degrees, 180 degrees, or any other amount from the direction of the static magnetic field. It is common practice in medical imaging to use sequences of 90 degrees and 180 degrees.

Another factor that is changed is the order of the sequences of the 90 degrees and 180 degrees RF pulses. Thus there are imaging methods wherein a 180 degrees pulse is used first and is followed by a 90 degree pulse. This sequence is known as inversion recovery. There is a method in which a 90 degree pulse is used first and subsequently a 180 degree pulse is applied. This sequence is known as spin-echo.

The spin-echo technique is ideally suited for obtaining accurate measurements of the T2 relaxation time in addition to the other characteristics that are provided by the NMR images. Note that in the spin-echo procedure the repeated applications of the 180 degree pulses result in repeated echoes. The repeated echoes lose amplitude at a rate determined by the time constant T2.

However, no matter which technique is used it is necessary to relate the measured spin densities to spatial locations. In practice the determination of particular locations is harder to achieve than in theory.

For example, it has been found that for pulses up to 90 degrees selective excitation of the imaged body is achieved by using a particular gradient during the application of the RF pulse. This procedure is called slice selection. The aim of this process is to excite slices with rectangular cross-sections. In theory the frequency of the applied RF pulse in conjunction with the field gradients excite only nuclei in the plane determined by field strength in accordance with the Larmor relationship. However, this statement is only an approximation: nuclei with Larmor frequency in the neighborhood of the applied RF pulse frequency are also excited. This deteriorates the slice porfile so that it no longer is rectangular.

There is no theory that tells how to excite an accurate rectangular slice of known width. However, people in the field usually use amplitude modulated RF pulses for this purpose. See, for example, L. E. Crooks, IEEE Transaction Nuclear Science, Vol. NS-27 (3), 1239, June 1980 and R. Sutherland, J. Huchinson, J. Physics E, Vol. 11 79 (1978). It was found that for RF pulses up to 90 degrees, a sinc (that is $(\sin 2\pi t)/2\pi t$, where t is the time) shaped amplitude modulated RF pulse provides adequate selection of the plane to be imaged. However, when 180 degrees pulses are used, such as during a spin-echo sequence, the sinc shaped pulse does not provide the necessary selectivity. See P. R. Locher Phil. Trans. R. Soc London B 289 537 (1980).

The use of the various imaging techniques are described in patents such as U.S. Pat. Nos. 4,307,344, 4,397,337 and 4,070,611 for example as well as the patents, scientific articles, and books noted in those patents. Among the patents cited above are patents that relate to means and methods for selectively exciting prescribed sections of the subject being imaged.

In summary, the present techniques for obtaining data exclusively from rectangular shaped slices are inadequate. The present techniques do not exclusively excite rectangular shaped slices for 180 degrees RF pulses. Also a part of the observed signal is obtained erroneously from non-selected slices. Thus, there is a present and relatively long-standing need to provide RF pulses which will excite nuclear magnetic moments only in selected rectangular slices.

BRIEF DESCRIPTION OF THE INVENTION

It is an object of the present invention to provide improvements in NMR imaging systems by which excitation of nuclear spins will occur substantially exclusively in examined regions and will be substantially eliminated from non-examined regions.

According to one aspect of the invention there is provided a method of selectively exciting sections of objects undergoing NMR imaging, said method comprises the steps of:
generating a static magnetic field parallel to a first axis of an imaginary three axes orthogonal system,
providing a magnetic field gradient to said static magnetic field,
said gradient operating with said static magnetic field to generate magnetic fields of predetermined strength in cross-sectional slices of said object,
applying a magnetic field rotating at a Larmor frequency in a selected one of said slices, and
shaping said rotating magnetic field with an envelope defined by the sum of a sinc function and a cosine function.

A related feature of the present invention provides said envelope generated by the sum of the sinc and cosine functions each multiplied by a time decaying smoothing function.

Still another related feature of the invention modulates the rotating field with an envelope defined by a sinc function and a sum of several cosine functions multiplied by a smoothing function.

BRIEF DESCRIPTION OF THE DRAWINGS

The above stated and other objects and features of the present invention will be more readily understood when considered with the following description of a broad aspect of the invention taken in conjunction with the following drawings, in which:

FIG. 4 is a graphical presentation of the magnitude of both the parallel (Mz) and perpendicular (Mxy) components of the nuclear magnetization (with respect to the static magnetic field) after an application of a 180 degree RF pulse according to this invention and normalized by the thermal equlibrium magnetization (Mo); and FIG. 5 is a graphical presentation of the magnitude of both the parallel (Mz) and perpendicular (Mxy) components of the nuclear magnetization (with respect to the static magnetic field) after application of a 180 degree RF pulse as used to obtain FIG. 4 and with further improvements according to this invention.

GENERAL DESCRIPTION

Figure 1:
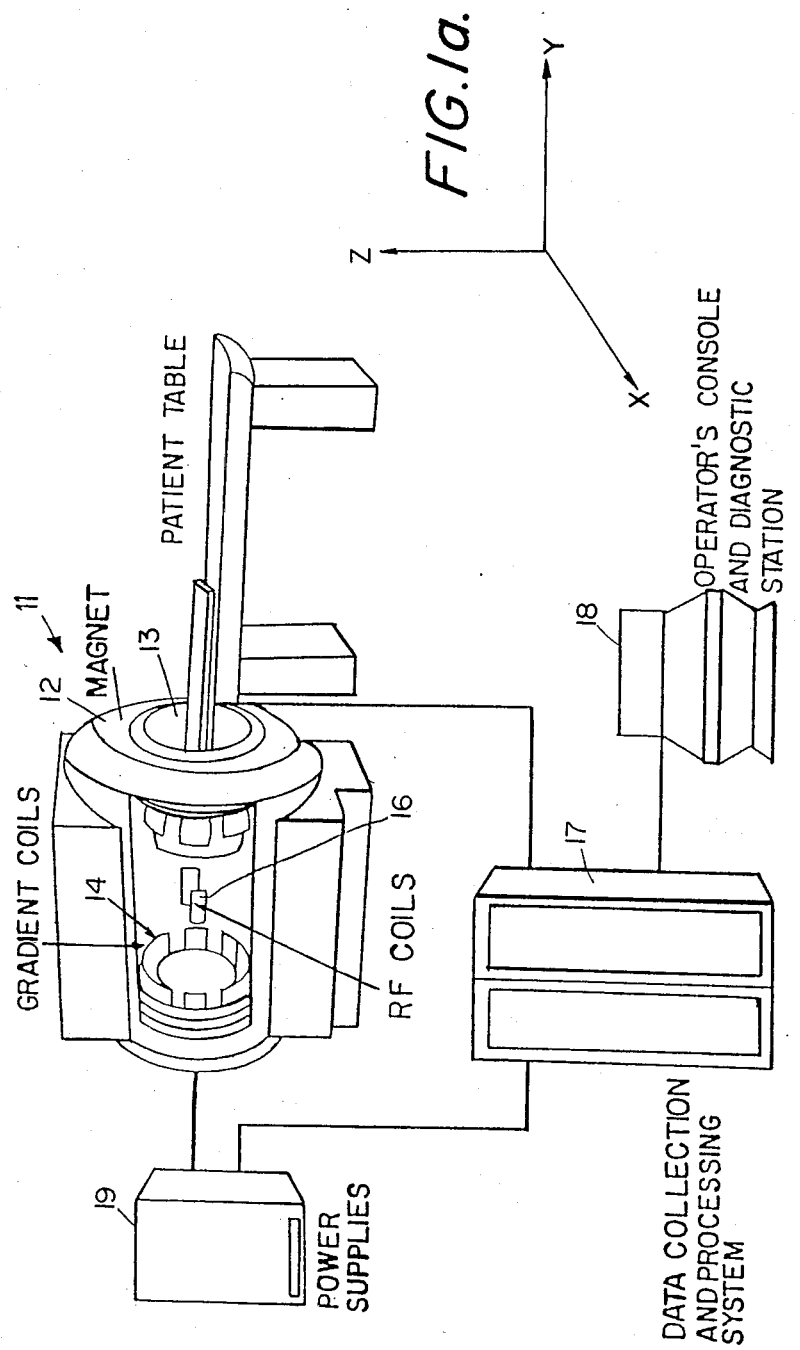
FIG. 1 is a general block diagram showing an NMR system.

FIG. 1 shows the essential portions of an NMR imaging system 11. FIG. IA shows an orthogonal coordinate system that is applicable in this description of the magnetic imaging system of FIG. 1. The NMR imaging system 11 includes a magnet 12 used to provide the large static magnetic field to which the patient is subjected while he is in the magnet bore 13. The static magnetic field is varied using a set of three gradient coils shown at 14 to enable determination of the location of the signals received from the system. The RF pulses used to excite specific slices of the patient's body are applied to the RF coils 16. Data collection and processing circuitry are shown as cabinet 17. The operator's console and diagnostic station which includes control circuitry and display circuitry are shown at 18. The system is powered by the power supplies shown at 19.

Figure 2:
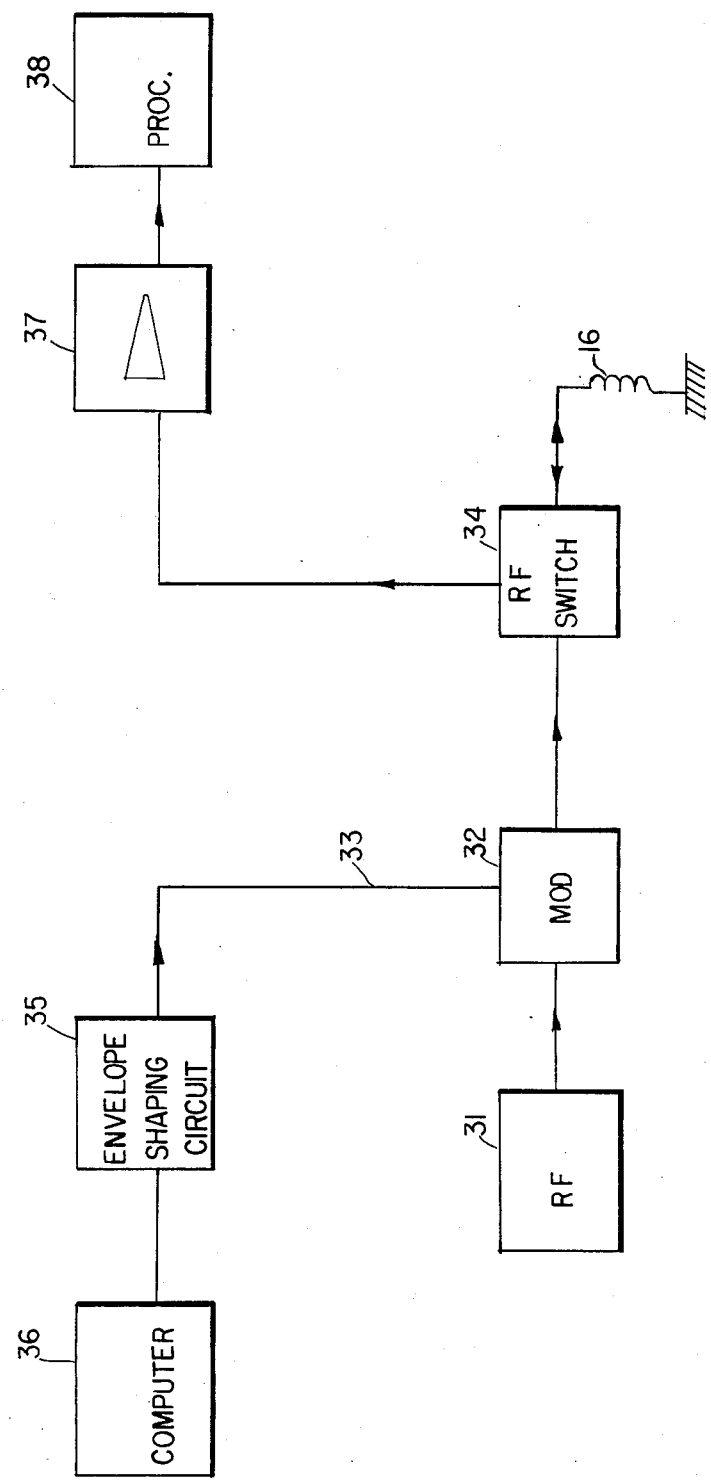
FIG. 2 is a block diagram showing an embodiment of the function generator used for modulating the RF pulse to shape the RF pulse.

Means are provided for shaping the 180 degree RF pulses to selectively excite slices in the patient's body. More particularly, an embodiment of apparatus for shaping the RF pulses is shown in FIG. 2. Therein, an RF generator for generating signals of the Larmor frequency is shown at 31. The generator provides the radio frequency pulse which is shaped or modulated in modulator 32 by signals received over conductor 33. The modulated RF signal passes through switch 34 to the RF coil 16 inside the magnet.

The modulation is accomplished by using an envelope shaping circuit 35 that transforms the digital data on the pulse shape produced by the system computer 36 to an analog voltage acceptable by the modulator 32.

When the RF pulse is terminated, the RF coils 16 receive the FID signal from the excited slice of the patient's body. This signal is routed through the RF switch 34 to the receiver amplifier 37 and processor 38 for further processing.

The modulating signal is:

$$f(x) = v_1 \left[ \frac{\sin 2\pi x}{2\pi x} \exp(-14.2 W_1^2 x^2) + A\cos(2\pi D x)\exp(-14.2 W_2^2 x^2) \right] \quad (1)$$

For a pulse of $\alpha$ degrees $v_1$ is set so that:

$$\int_{-\infty}^{+\infty} f(x)dx = \frac{\alpha}{360°}$$

Thus for a 180 degree pulse $v_1$ is set fo fulfill $$\int_{-\infty}^{+\infty} f(x)dx = \tfrac{1}{2} \quad (2)$$

Here x is defined as time (dt) in units of p, where p is the central lobe width of the sinc function $\sin(2\pi x)/2\pi x$.

W1 and W2 are half width at half height of the gaussian bell shaped functions $\exp(-14.2 W^2 x^2)$. the units of W and $v_1$ are 1/p.

The RF pulse used to produce the slice of FIG. 4 was tailored by using:
A=0.65
D=1.05 (1/P)
$W_1$=0.17 (1/P)
$W_2$=0.55 (1/P)
P=1–3 ms.

In the usual NMR imaging experiments p varies from 1 to 3 msec.

More generally, the modulating function is any function that can be expanded and includes a linear combination of a sinc function plus a cosine function, such as:

$$f(x) = v_1 \left[ \text{Sinc}(x) \cdot g(x) + \sum_{i=1}^{N} A i \cos(2\pi D i x) g i(x) \right] \quad (3)$$

The bracketed function represents a sinc function multiplied by a time decaying function g(x) plus the summation of a plurality of cosine functions multiplied by similar time decaying smoothing functions.

Figure 3:
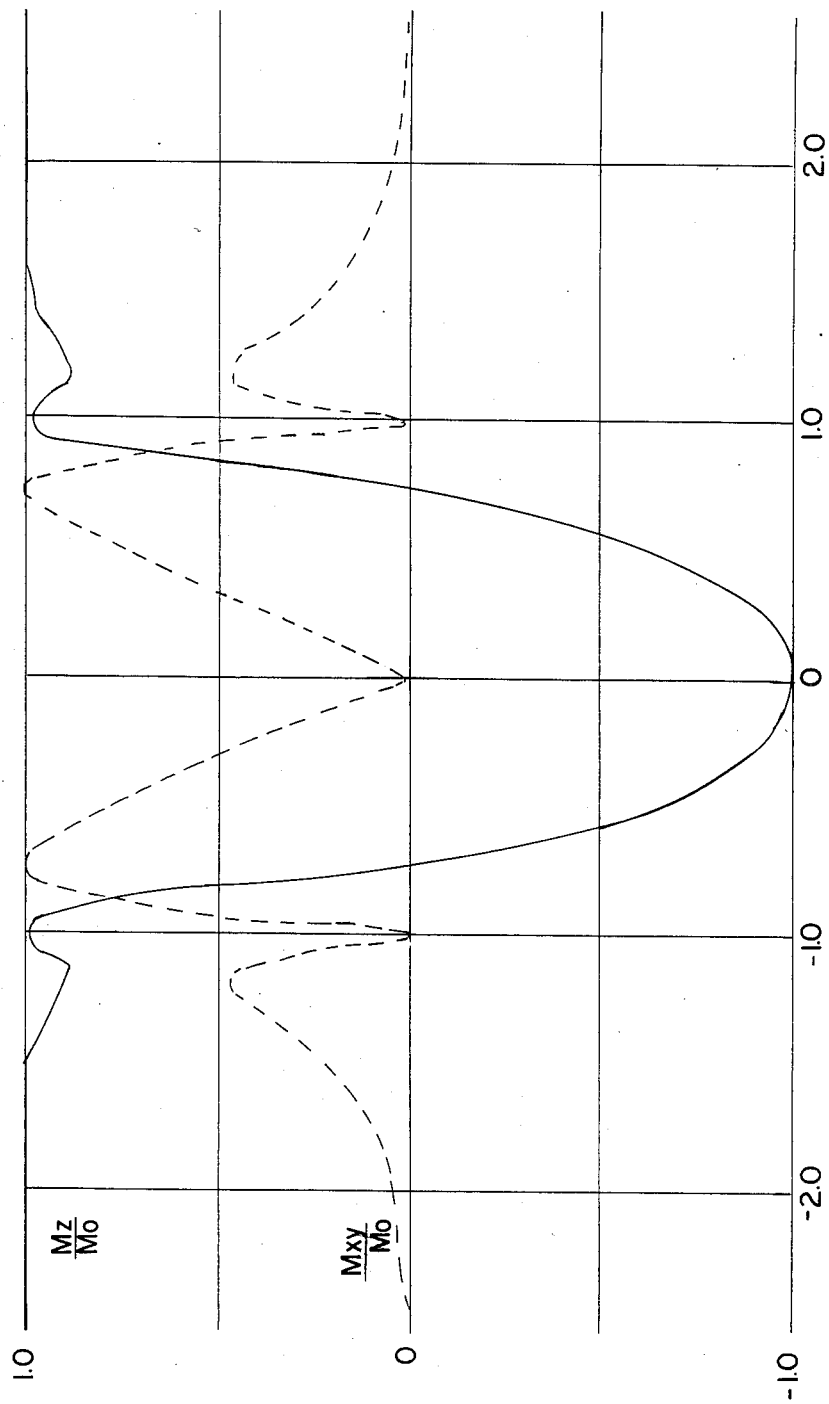
FIG. 3 is a graphical presentation of the magnitude of both the parallel (Mz) and perpendicular $(Mxy=sqrt(Mx^2+My^2))$ components of the nuclear magnetization (with respect to the static magnetic field) after an application of a 180 degree pulse according to prior art slice selection normalized by the thermal equilibrium magnetization (Mo)

By using the function:

$$f(x) = v_1 \left[ (\text{Sinc}(x) \exp(-14.2 W1^2 X^2) + \sum_{i=1}^{N} Ai \cos(2\pi D i x) \exp(-14.2\, W2^2 i x^2) \right] \quad (4)$$

where:
W1=0.17
A1=0.206
D1=1.18
W21=0.45
A2=0.4
D2=1
W22=1
A3=0.1
D3=0.65
W23=0.6
A4=0.11
D4=0.65
W24=0.45
A5=0.1
D5=0.65
W25=0.3
A6=0.1
D6=0.65
W26=0.15 as the modulating function of a 180 degree pulse, the side lobes of the transverse magnetization Mxy can be completely removed, as seen in FIG. 5, if $vi$ in Eq. (4) is set according to Eq (2). Note that the general function of Eq. (3) and in particular the function defined by Eq. (4) can produce slice profiles vastly superior to the slice profiles of the prior art shown in FIG. 3. The superior slice selections results in better NMR images. FIGS. 3 and 4 were produced by an exact stepwise computer calculation of the Bloch Equations.

This invention has been described with regard to certain exemplary embodiments. It should be understood that this description is made by way of example and not as a limitation on the scope of the invention.

What is claimed is:

1. A method of selectively exciting sections of objects undergoing NMR imaging, said method comprising the steps of:
generating a static magnetic field parallel to a first axis of three axes orthogonal system,
providing a magnetic field gradient to said static magnetic field to generate magnetic fields of predetermined strength in cross sectional slices of said object,
applying a magnetic field rotating at a Larmor frequency in a selected one of said slices, and
shaping said rotating magnetic field with an envelope described by the sum of a sinc function and a cosine function to excite slices in the object with rectangular cross sections.

2. A method of selectively exciting sections of patients' bodies undergoing NMR imaging; said method comprising the steps of:
generating a static magnetic field parallel to a first axis of a three axes orthogonal system,
providing a time dependent magnetic gradient to said static magnetic field,
said gradient operating to vary said static magnetic field a predetermined amount to enable exciting cross-sectional slices of said object,
applying a magnetic field rotating at the Larmor frequency of a selected element in a desired one of said slices, and
modulating the rotating field with a modulating envelope that comprises a sum of a sinc function multiplied by a time decaying function and at least one cosine function multiplied by a similar time decaying function.

3. The method of claim 1 wherein said rotating field is perpendicular to said static field.

4. The method of claim 2 wherein said modulating envelope is defined by a sinc function multiplied by a smoothing function and a sum of a plurality of cosine functions multiplied by a smoothing function.

5. The method of claim 4 wherein said modulating envelope is any function that can be expanded and includes a sinc function plus a cosine function of the form:

$$f(x) = v_1 \left[ \text{sinc}(x)q(x) + \sum_{i=1}^{N} A_i \cos(2\pi D_i x) q_i(x) \right]$$

6. The method of claim 5 wherein $v$ is set so that $$\int_{-\infty}^{\infty} f(x)dx = \frac{\alpha}{360°}$$

where $\alpha$ is the angle by which the rotating field rotates the nuclear magnetization relative to the static field.

7. The method of claim 6 wherein said rotating magnetic field is obtained by the step of applying an RF pulse to generate a magnetic field transverse to said static field, and modulating said RF pulse to obtain said envelope.

8. A system of selectively exciting sections of objects undergoing NMR imaging, said system comprising:
    means for generating a static magnetic field parallel to a first axis of an imaginary three axes orthogonal system,
    means for providing a magnetic field gradient to said static magnetic field to generate magnetic fields of predetermined strength in cross sectional slices of said object,
    means for applying a magnetic field rotating at a Larmor frequency in a selected one of said slices, and
    means for shaping said rotating magnetic field with an envelope described by the sum of a sinc function and a cosine function to excite slices in the object with rectangular cross sections.

9. A system of selectively exciting sections of patient's bodies undergoing NMR imaging; said system comprising:
    means for generating a static magnetic field parallel to a first axis of a three axes orthogonal coordinate system,
    means for providing a time dependent gradient to said static magnetic field,
    said gradient operating to vary said static magnetic field a predetermined amount to enable exciting cross-sectional slices of said object,
    means for applying a magnetic field rotating at the Larmor frequency of a desired element in a selected one of said slices, and
    means for modulating the rotating field with a modulating envelope that comprises a sum of a sinc function multiplied by a time decaying function and at least one cosine function multiplied by a similar time decaying function.

10. The system of claim 9 wherein said rotating field is perpendicular to said static field.

11. The system of claim 9 wherein said modulating envelope is defined by a sinc function multiplied by a smoothing function and a sum of a plurality of cosine functions multiplied by a smoothing function.

12. The system of claim 10 wherein said modulating envelope is any function that can be expanded and includes a sinc function plus a cosine function, of the form:

$$f(x) = \left[ \text{sinc}(x)g(x) + \sum_{i=1}^{N} A_i \cos(2\pi D_i X) g_i(x) \right]$$

13. The system of claim 12 wherein $v$ is set so that $$\int_{-\infty}^{\infty} f(x)dx = \frac{\alpha}{360°}$$

where $\alpha$ is the angle by which the rotating field rotates the nuclear magnetization relative to the static field.

14. The system of claim 13 wherein said means of applying said rotating magnetic field includes means for applying an RF pulse to generate a magnetic field transverse to said static field, and means for modulating said RF pulse to obtain said envelope.

* * * * *